(12) United States Patent
Xiang

(10) Patent No.: US 11,411,189 B2
(45) Date of Patent: Aug. 9, 2022

(54) FLEXIBLE OLED MODULE STACKED STRUCTURE AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Lei Xiang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 440 days.

(21) Appl. No.: 16/478,987

(22) PCT Filed: Apr. 11, 2019

(86) PCT No.: PCT/CN2019/082164
§ 371 (c)(1),
(2) Date: Jul. 18, 2019

(87) PCT Pub. No.: WO2020/155384
PCT Pub. Date: Aug. 6, 2020

(65) Prior Publication Data
US 2021/0336161 A1    Oct. 28, 2021

(30) Foreign Application Priority Data

Feb. 1, 2019   (CN) .......................... 201910103183.2

(51) Int. Cl.
*H01L 51/00*    (2006.01)
*B32B 5/18*    (2006.01)
(Continued)

(52) U.S. Cl.
CPC ............ *H01L 51/0097* (2013.01); *B32B 5/18* (2013.01); *B32B 7/12* (2013.01); *B32B 17/10* (2013.01);
(Continued)

(58) Field of Classification Search
None
See application file for complete search history.

(56) References Cited

U.S. PATENT DOCUMENTS

2005/0153476 A1   7/2005   Park et al.
2014/0217382 A1*  8/2014   Kwon ................. H01L 51/5246
                                                        257/40
(Continued)

FOREIGN PATENT DOCUMENTS

CN   105355645 A   2/2016
CN   106654063 A   5/2017
CN   107705716 A   2/2018

*Primary Examiner* — J. E. Schoenholtz

(57) ABSTRACT

The present invention provides a flexible organic light emitting diode (OLED) module stacked structure and a manufacturing method of the flexible OLED module stacked structure. The structure includes a substrate, a thin film transistor (TFT) array layer, an OLED element layer, a thin film encapsulation layer, a cover plate, and a foam layer. The thin film encapsulation layer is disposed on the OLED element layer, and entirely covers the OLED element layer. The foam layer is disposed on one side of the substrate away from the TFT array layer. The protective film in place of a back plate is used and removed, and the foam layer is used to provide a support and buffering function, so an overall thickness is reduced, and less ash is produced.

10 Claims, 4 Drawing Sheets

(51) Int. Cl.
*B32B 7/12* (2006.01)
*B32B 17/10* (2006.01)
*B32B 27/06* (2006.01)
*B32B 27/28* (2006.01)
*H01L 27/32* (2006.01)
*H01L 51/52* (2006.01)
*H01L 51/56* (2006.01)

(52) U.S. Cl.
CPC .......... *B32B 27/065* (2013.01); *B32B 27/281* (2013.01); *H01L 27/323* (2013.01); *H01L 27/3244* (2013.01); *H01L 51/003* (2013.01); *H01L 51/524* (2013.01); *H01L 51/5281* (2013.01); *H01L 51/56* (2013.01); *B32B 2250/05* (2013.01); *B32B 2307/42* (2013.01); *B32B 2457/206* (2013.01); *B32B 2457/208* (2013.01); *H01L 2227/323* (2013.01); *H01L 2227/326* (2013.01); *H01L 2251/5338* (2013.01)

(56) References Cited

U.S. PATENT DOCUMENTS

| | | | |
|---|---|---|---|
| 2018/0138257 A1* | 5/2018 | Higano | H01L 27/3244 |
| 2019/0096964 A1* | 3/2019 | Odaka | H01L 51/003 |
| 2019/0333978 A1* | 10/2019 | Lee | H01L 51/0097 |
| 2020/0013987 A1* | 1/2020 | Lee | H01L 51/0097 |
| 2020/0136085 A1* | 4/2020 | Wang | H01L 51/0097 |
| 2020/0150481 A1* | 5/2020 | You | G02F 1/133308 |
| 2021/0111357 A1* | 4/2021 | Kawaguchi | H01L 27/323 |
| 2021/0335971 A1* | 10/2021 | Zhao | H01L 27/3276 |

* cited by examiner

FLEXIBLE OLED MODULE STACKED STRUCTURE AND MANUFACTURING METHOD THEREOF

1. FIELD OF DISCLOSURE

The present invention relates to a field of display devices and in particular, to a flexible organic light emitting diode (OLED) module stacked structure and a manufacturing method thereof.

2. DESCRIPTION OF RELATED ART

Organic Light Emitting Diode (OLED) displays are a promising flat panel display technology with features such as self-illumination, simple structure, ultra-thin, fast response, wide viewing angle, low power consumption, and flexible display. At present, OLED displays have been favored by major display manufacturers, and become a third generation display after cathode ray tube (CRT) displays and liquid crystal displays (LCD).

However, at present, in manufacturing small-sized OLED products, a back-plate bonding step is performed in a module-stage manufacturing process, and a back plate only serves to support, buffer, and provide a protection effect to a substrate during a manufacturing process of a flexible OLED module stacked structure. On one hand, since the flexible OLED module stacked structure requires bending a bonding pad. Therefore, the back plate needs to adopt a two-segment structure, such that a middle portion of the back plate is a layer of air, and when laser cutting is performed through the layer of air, more ash is generated. On the other hand, the back-plate structure has high material costs and tends to cause bubbles after bonding, which not only affects a product's appearance, but also causes greater bonding difficulty in the back plate. Moreover, the back plate structure has a certain thickness, so that the flexible OLED module stacked structure has a greater thickness, which in turn affects a thickness of the OLED product, and does not meet the current trend.

Therefore, it is necessary to provide a new flexible OLED module stacked structure and a manufacturing method thereof to solve the above problems.

SUMMARY

The present invention provides a flexible organic light emitting diode (OLED) module and a manufacturing method thereof. The present invention solves an existing problem in conventional techniques. The problem is that a back plate disposed on a substrate needs to adopt a two-segment structure, resulting in more difficulty in bonding, a greater thickness, and more ash generated.

Accordingly, the present invention provides solutions as follows.

The present invention provides a flexible organic light emitting diode (OLED) module stacked structure, comprising:
 a substrate;
 a thin film transistor (TFT) array layer disposed on the substrate;
 an OLED element layer disposed on the TFT array layer;
 a thin film encapsulation layer disposed on the OLED element layer, the thin film encapsulation layer entirely covering the OLED element layer;
 a cover plate disposed at one end of the thin film encapsulation layer, wherein the cover plate is a three-dimensional (3D) cover; and
 a foam layer disposed on one side of the substrate away from the TFT array layer.

According to one embodiment of the flexible OLED module stacked structure of the present invention, the flexible OLED module stacked structure further comprises a touch panel, wherein the touch panel is disposed on the thin film encapsulation layer.

According to one embodiment of the flexible OLED module stacked structure of the present invention, the flexible OLED module stacked structure further comprises a polarizing plate, wherein the polarizing plate is disposed on the touch panel.

According to one embodiment of the flexible OLED module stacked structure of the present invention, an optically clear adhesive (OCA) is disposed among the thin film encapsulation layer, the touch panel, the polarizing plate, and the cover plate for adhering them together.

According to one embodiment of the flexible OLED module stacked structure of the present invention, a material of the substrate comprises polyimide.

According to one embodiment of the flexible OLED module stacked structure of the present invention, the foam layer is made of a combination of foam, copper, and graphite.

According to one embodiment of the flexible OLED module stacked structure of the present invention, an outer lead reinforcing plate is disposed on one side of the foam layer away from the substrate.

According to one embodiment of the flexible OLED module stacked structure of the present invention, the cover plate is a glass plate.

According to one embodiment of the present invention, a flexible organic light emitting diode (OLED) module stacked structure is provided, comprising:
 a substrate;
 a thin film transistor (TFT) array layer disposed on the substrate;
 an OLED element layer disposed on the TFT array layer;
 a thin film encapsulation layer disposed on the OLED element layer, the thin film encapsulation layer entirely covering the OLED element layer;
 a cover plate disposed at one end of the thin film encapsulation layer; and
 a foam layer disposed on one side of the substrate away from the TFT array layer to protect the substrate.

According to one embodiment of the flexible OLED module stacked structure of the present invention, the flexible OLED module stacked structure further comprises a touch panel, wherein the touch panel is disposed on the thin film encapsulation layer.

According to one embodiment of the flexible OLED module stacked structure of the present invention, the flexible OLED module stacked structure further comprises a polarizing plate, wherein the polarizing plate is disposed on the touch panel.

According to one embodiment of the flexible OLED module stacked structure of the present invention, an optically clear adhesive (OCA) is disposed among the thin film encapsulation layer, the touch panel, the polarizing plate, and the cover plate for adhering them together.

According to one embodiment of the flexible OLED module stacked structure of the present invention, a material of the substrate comprises polyimide.

According to one embodiment of the flexible OLED module stacked structure of the present invention, the foam layer is made of a combination of foam, copper, and graphite.

According to one embodiment of the flexible OLED module stacked structure of the present invention, an outer lead reinforcing plate is disposed on one side of the foam layer away from the substrate.

According to one embodiment of the flexible OLED module stacked structure of the present invention, the cover plate is a glass plate.

According to one embodiment of the present invention, a manufacturing method of a flexible organic light emitting diode (OLED) module stacked structure is provided, comprising following steps:

S10: coating a glass plate with polyimide (PI) to form a substrate;

S20: sequentially forming a thin film transistor (TFT) array layer, an OLED element layer, and a thin film encapsulation layer on the substrate;

S30: removing the glass plate from the substrate;

S40: adhering a protective film onto one side of the substrate away from the TFT array layer;

S50: chamfering the substrate;

S60: adhering a cover plate on one side of the substrate adjacent to the TFT array layer;

S70: removing the protective film from the substrate;

S80: adhering a foam layer onto one side of the substrate away from the TFT array layer; and S90: bending a bonding pad after adhering an outer lead reinforcing plate and a chip on film (COF) on one side of the foam layer away from the substrate.

According to one embodiment of the present invention, the manufacturing method of the flexible OLED module stacked structure further comprises adhering sequentially a touch panel and a polarizing plate onto the thin film encapsulation layer.

According to one embodiment of the manufacturing method of the flexible OLED module stacked structure of the present invention, in step S50, a laser lift-off process is performed to remove the glass plate from the substrate.

According to one embodiment of the manufacturing method of the flexible OLED module stacked structure of the present invention, in step S60, a laser chamfering process is performed to chamfer the substrate.

The advantages of the present invention are as follows: in the flexible OLED module stacked structure and the manufacturing method thereof provided by the present invention, the protective film instead of a back plate is used to protect the substrate during a module manufacture process, and when the protective film is removed, the foam layer is still there to support, protect, and provide a buffer to the substrate. Therefore, an overall thickness of the flexible OLED module stacked structure is reduced, the bonding difficulty is little, and ash is less generated during a cutting process, thereby reducing production costs.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work or paying the premise.

DETAILED DESCRIPTION OF EMBODIMENTS

Embodiments of the present disclosure are described in detail with reference to the accompanying drawings as follows. Directional terms such as up/down, front/rear, right/left, inside/outside, and the like may be used for the purpose of enhancing a reader's understanding about the accompanying drawings, but are not intended to be limiting. Specifically, the terminologies in the embodiments of the present disclosure are merely for the purpose of describing certain embodiments, but not intended to limit the scope of the invention. The same reference numbers are used throughout the drawings to refer to the same or similar parts.

The present invention is directed to solving existing problems in a conventional flexible organic light emitting diode (OLED) module stacked structure and a manufacturing method thereof. The present invention solves the problems that the back plate disposed on the substrate needs to adopt a two-segment structure, which causes great bonding difficulty and a greater thickness, and tends to produce ash. The present invention can solve the drawback.

FIRST EMBODIMENT

Figure 1:
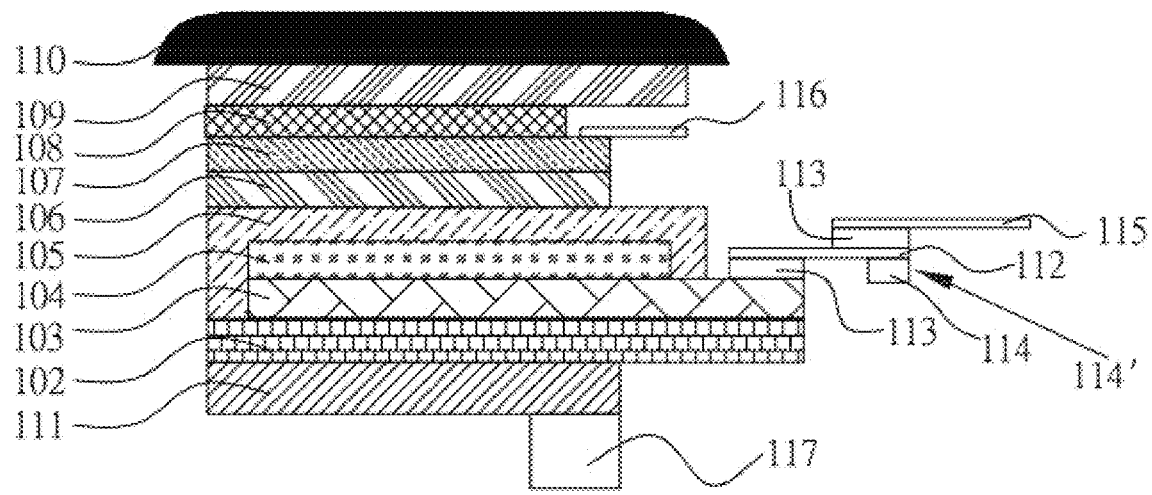
FIG. 1 is a schematic structural view illustrating a flexible organic light emitting diode (OLED) module stacked structure according to a first embodiment of the present invention.

Referring to FIG. 1, the present invention provides a flexible organic light emitting diode (OLED) module stacked structure 100, the flexible OLED module stacked structure 100, comprising:

a substrate 102;

a thin film transistor (TFT) array layer 103 disposed on the substrate 102;

an OLED element layer 104 disposed on the TFT array layer 103;

a thin film encapsulation layer 105 disposed on the OLED element layer 104, the thin film encapsulation layer 105 entirely covering the OLED element layer 104;

a cover plate 110 disposed at one end of the thin film encapsulation layer 105, wherein the cover plate 110 is fixed to the substrate 102; and a foam layer 111 disposed on one side of the substrate 102 away from the TFT array layer 103 to protect the substrate 102.

The substrate 102 is made of polyimide (PI), which can withstand high temperatures and has good bending properties. The TFT array layer 103 consists of a plurality of TFTs arranged in an array, and the TFTs are used as switching devices and driving devices of the flexible OLED module stacked structure 100. At the same time, the TFT array layer 103 is provided with a first flexible circuit board 112, and the TFT array layer 103 and the first flexible circuit board 112 can be bonded by a conductive film (ACF) 113. An integrated circuit (IC) chip 114 is disposed on the first flexible circuit board 112 to form a chip on film (COF) 114, and the first flexible circuit board 112 and a printed circuit board (PCB) 115 can be connected through the ACF 113.

The OLED element layer 104 includes an anode, a hole injection layer, a hole transport layer, an organic light-emitting layer, an electron transport layer, an electron injection layer, and a cathode which are sequentially disposed above the TFT array layer 103.

A thin film encapsulating method can be employed, wherein the thin film encapsulation layer 105 mainly adopts a stacked structure of a barrier layer and a buffer layer disposed on the OLED device layer 104, and the thin film encapsulation layer 105 completely covers the OLED element layer 104. The barrier layer functions to isolate moisture/oxygen to prevent moisture or oxygen from intruding into the OLED element layer 104 to weaken the illumination. The buffer layer mainly eliminates stress, notches, and voids between the two barrier layers.

The cover plate 110 is disposed at one end of the thin film encapsulation layer 105 and is fixed to the substrate 102 by adhering. The cover plate 110 may be a three dimensional (3D) cover plate, and the cover plate 110 may be a glass plate.

The foam layer 111 is disposed on one side of the substrate 102 away from the TFT array layer 103, and can support and protect the substrate 102. The foam layer 111 can be made of a combination of foam, copper foil, and graphite, and the foam, copper foil, and graphite are sequentially arranged. Between the copper foil and the graphite, and also between the foam and the copper foil, a double-sided adhesive tape is disposed for bonding them together. At the same time, the foam layer 111 can also be connected to the substrate 102 by a double-sided adhesive tape.

An outer lead reinforcing plate 117 is disposed on one side of the foam layer 111 away from the substrate 102 to make an outer lead bonding (OLB) region of the flexible OLED module stacked structure 100 more resistant against bending.

The flexible OLED module stacked structure 100 further comprises a touch panel 107. The touch panel 107 is adhered to the thin film encapsulation layer 105. The touch panel 107 is adhesively assembled with the thin film encapsulation layer 105 by a first optically clear adhesive (OCA) 106, and the touch panel 107 is connected to the second flexible circuit board 116.

The flexible OLED module stacked structure 100 further comprises a polarizing plate 108. A light-emitting/displaying side of the polarizing plate 108 is attached to the touch panel 107, and a second OCA 109 can be disposed between the other side of the polarizing plate 108 and the cover plate 110 for adhering them together.

SECOND EMBODIMENT

Referring to FIGS. 2A to 2G, the present invention provides a manufacturing method of a flexible organic light emitting diode (OLED) module stacked structure, comprising following steps:

S10: coating a glass plate 201 with polyimide (PI) to form a substrate 202; wherein the substrate 202 can be formed by coating the glass plate 201 with polymide, and the substrate 202 can include a material having moisture/oxygen absorbing properties to improve the ability of the substrate 202 to resist against moisture/oxygen.

S20: sequentially forming a thin film transistor (TFT) array layer 203, an OLED element layer 204, and a thin film encapsulation layer 205 on the substrate 202; comprising steps as follows:

S201: forming the TFT array layer 203 on the substrate 202, wherein the TFT array layer 203 consists of a plurality of TFTs arranged in an array, the TFT array layer 203 is provided with a first flexible circuit board 212, the TFT array layer 203 and the first flexible circuit board 212 can be bonded with an anisotropic conductive film (ACF) 213, and the first flexible circuit board 212 is connected to a printed circuit board (PCB) 215.

S202: forming the OLED element layer 204 on the TFT array layer 203; and wherein the OLED element layer 204 may be formed on the TFT array layer 203 by an evaporation method, in which an anode, a hole injection layer, a hole transport layer, and an organic light-emitting layer, an electron transport layer, and an electron injection layer, and a cathode are sequentially formed over the TFT array layer 203.

S203: forming a thin film encapsulation layer 205 on the OLED element layer 204, so that the thin film encapsulation layer 205 entirely covers the OLED element layer 204;

wherein the thin film encapsulating can be performed by plasma enhanced chemical vapor deposition (PECVD).

Furthermore, a touch panel 207 and a polarizing plate 208 may be sequentially attached to the thin film encapsulation layer 205, and the touch panel 207 may be attached to the thin film encapsulation layer 205 through a first optically clear adhesive (OCA) 206. The touch panel 207 and a second flexible circuit board 216 are connected to each other.

Figure 2A:
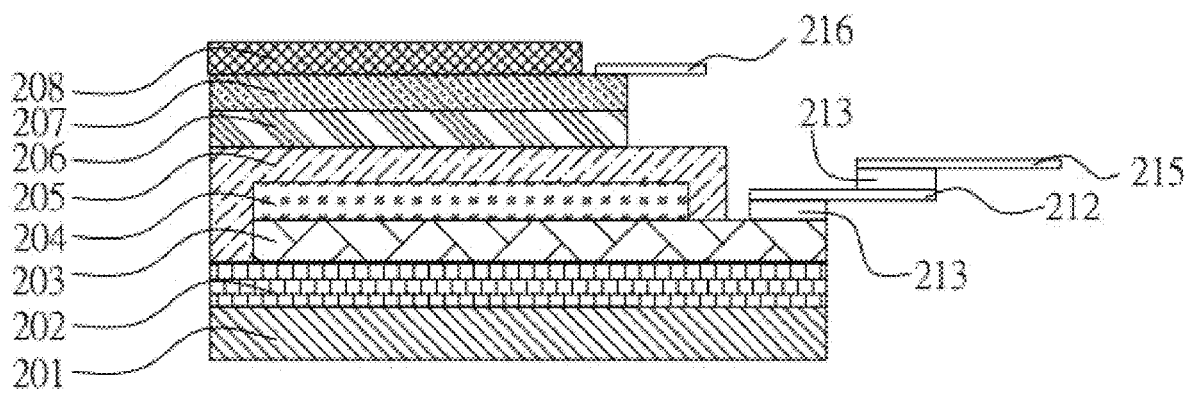
FIGS. 2A to 2G are schematic structural views illustrating the OLED module stacked structure according to a second embodiment of the present invention.
Figure 2B:
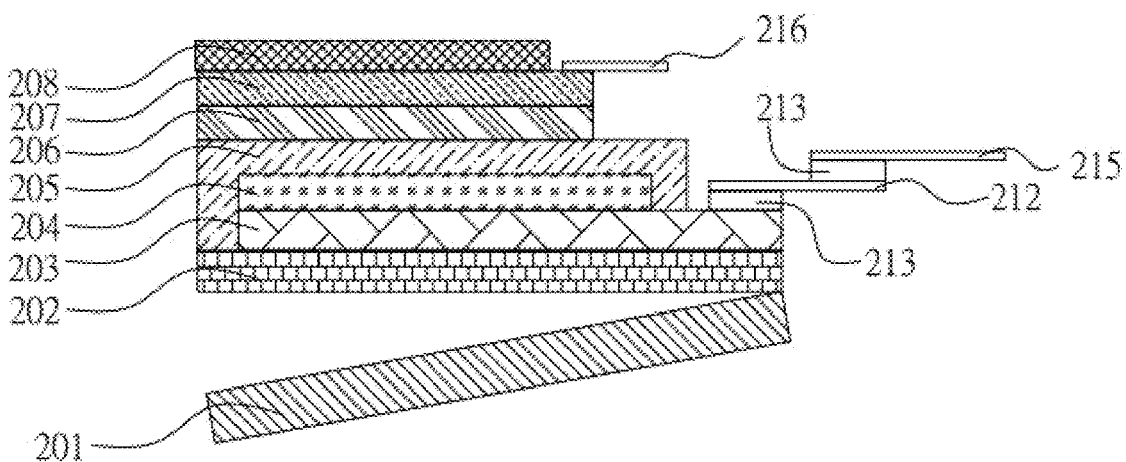

S30: removing the glass plate 201 from the substrate 202;

Referring to FIG. 2B, a laser lift-off process is performed to remove the glass plate 201 from the substrate 202.

Figure 2C:
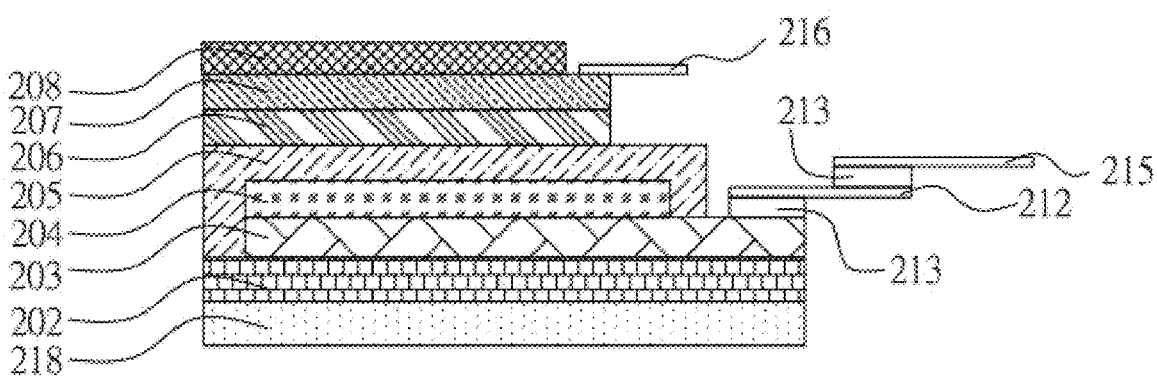

S40: adhering a protective film 218 onto one side of the substrate 202 away from the TFT array layer 203;

Referring to FIG. 2C, the substrate 202 is a flexible substrate, so the substrate 202 is easily damaged after the glass plate 201 is removed from the substrate 202. Therefore, a protective film 218 can be attached to one side of the substrate 202 away from the TFT array layer 203, and the protective film 218 uniformly and evenly covers a surface of the substrate 202 to protect the same. Since the protective film 218 needs to be taken away in a subsequent process, the protective film 218 is not required to be made of a high-cost material, which saves production costs.

S50: chamfering the substrate 202;

The substrate 202 can be chamfered by a laser chamfering method which enables highly precise cutting. Compared with a conventional flexible OLED module stacked structure, the protective film 218 uniformly and evenly covers the surface of the substrate 202. As a result, when a laser chamfering process is performed, since the protective film 218 does not have a layer of air, a laser beam would not pass through a layer of air of the protective film, less ash is generated, and the substrate 202 is less affected.

Figure 2D:
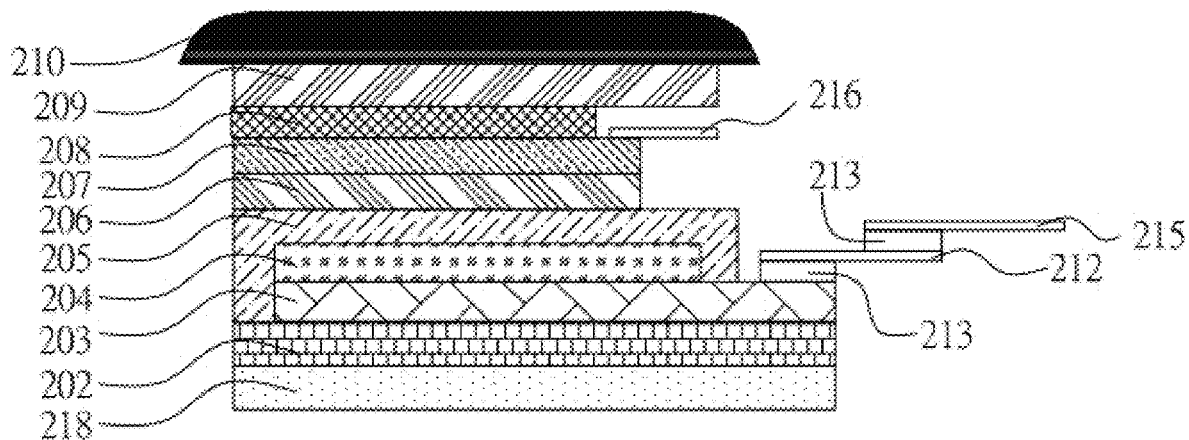

S60: adhering a cover plate 210 on one side of the substrate 202 adjacent to the TFT array layer 203;

Referring to FIG. 2D, the cover plate 210 is adhered to the polarizing plate 208 by a second OCA. The cover plate 210 can be a three dimensional (3D) cover, and the cover plate 210 can be a glass plate.

Figure 2E:
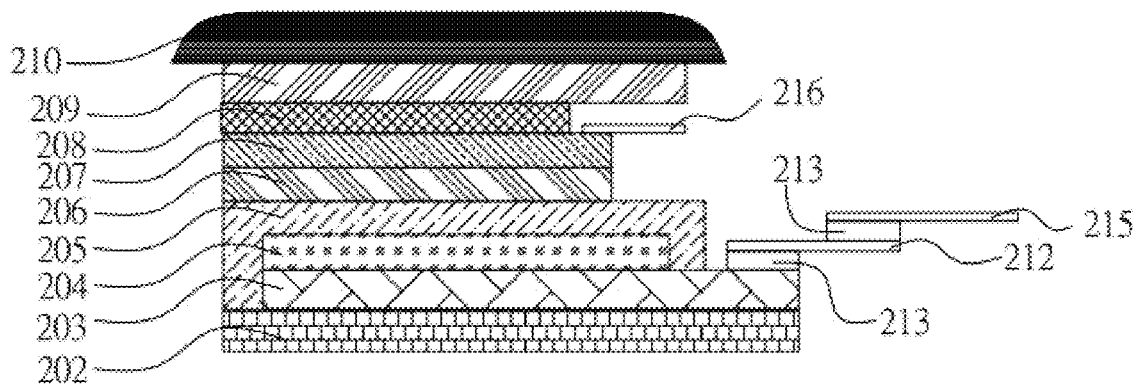

S70: removing the protective film 218 from the substrate 202;

Referring to FIG. 2E, the protective film 218 is removed from the surface of the substrate 202. Therefore, the flexible OLED module stacked structure 200 obtained by performing the method of the embodiment does not include the protective film 218, but the conventional flexible OLED module stacked structure further comprises a back plate with a thickness of generally about 90 um. Therefore, an overall thickness of the flexible OLED module stacked structure 200 in the embodiment can be reduced by about 90 um, which makes the present invention meet a current trend of increasingly thinner display screens.

Figure 2F:
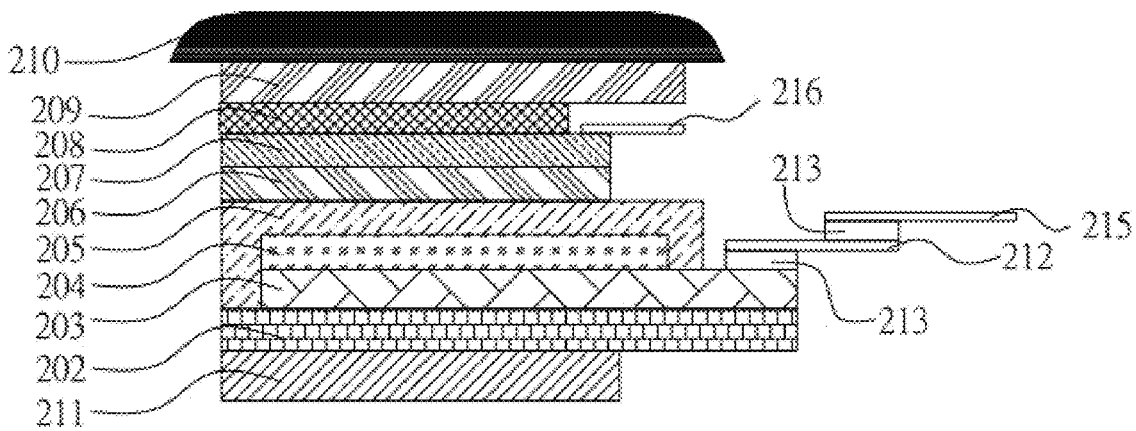

S80: adhering a foam layer 211 onto one side of the substrate 202 away from the TFT array layer 203;

As shown in FIG. 2F, after the protective film 218 is removed from the substrate 202, the foam layer 211 is attached onto one side of the substrate 202 away from the TFT array layer 203. Since the foam layer 211 can support and protect the substrate 202, the protective film 218 can be removed without affecting the performance of the substrate 202. The foam layer 211 can consist of foam, copper foil, and graphite, and the foam, copper foil, and graphite are sequentially arranged. Between the copper foil and the graphite, and between the foam and the copper foil, a double-sided adhesive tape is disposed for bonding them together. At the same time, the foam layer 211 can also be connected to the substrate 202 by a double-sided adhesive tape.

S90: bending a bonding pad after adhering an outer lead reinforcing plate 217 and a chip on film (COF) on the flexible OLED module stacked structure 200.

Figure 2G:
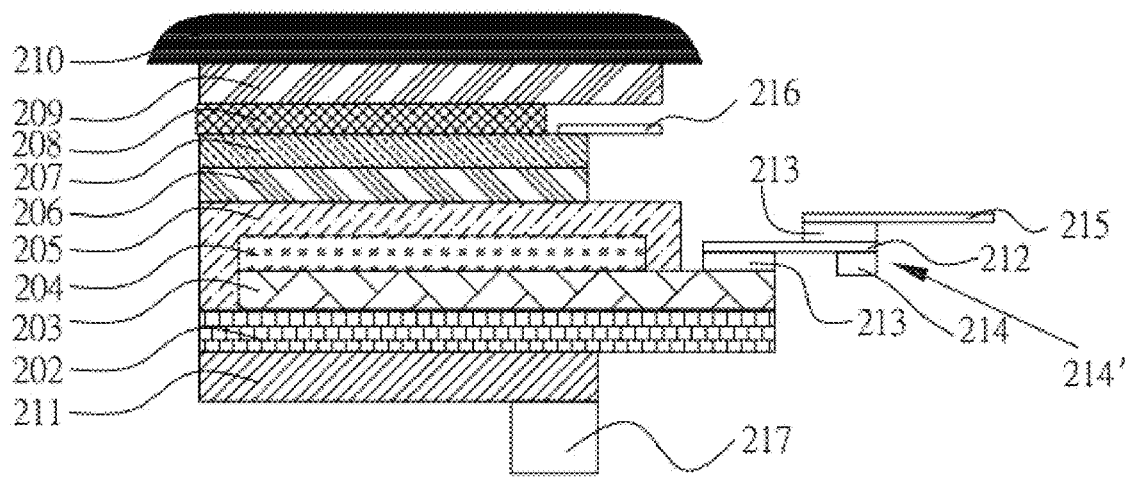
Figure 3:
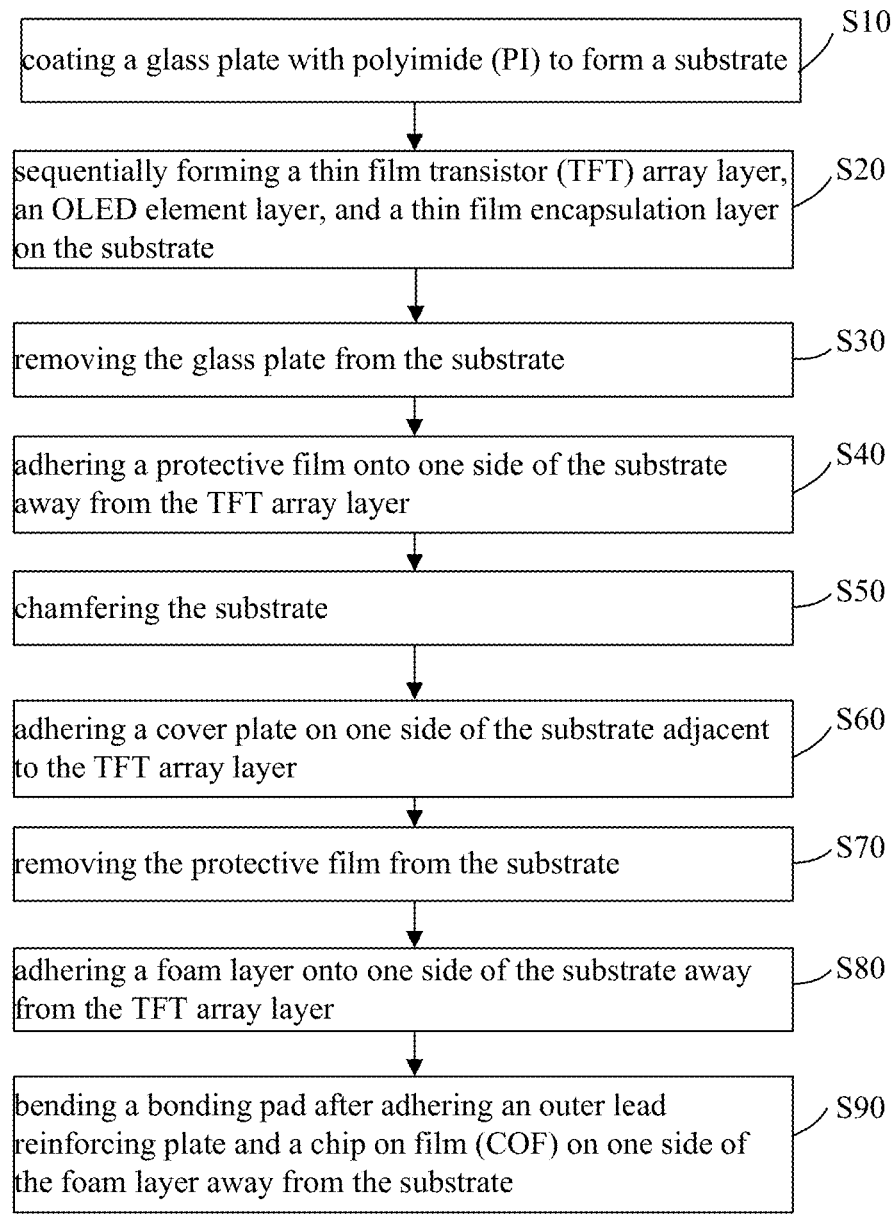
FIG. 3 is a process flow diagram illustrating a manufacturing method of the OLED module stacked structure according to the second embodiment of the present invention.

Referring to FIG. 2G, one side of the outer lead reinforcing plate 217 is attached to a surface of the foam layer 211, and another side of the outer lead reinforcing plate 217 is attached to an outer lead bonding (OLB) region of the glass plate 201 to improve bending resistance of the entire OLB region. An integrated circuit (IC) chip 214 is disposed on the first flexible circuit board 212 to form a chip on film (COF) 214'. The COF 214' is attached on the TFT array layer 203. The COF 214' and the TFT array layer 203 can be bonded by the ACF 213.

In the OLED module stacked structure 200, the protective film 218 does not have a segmented design, so the bonding difficulty is relatively low. Furthermore, the protective film 218 is already removed from the surface of the substrate 202 before the bonding pad is bent. The protective film 218 does not affect bending the bonding pad of the flexible OLED module stacked structure. Compared with the conventional flexible OLED module stacked structure, the manufacturing process is simplified to save production costs.

The advantages of the present invention are as follows: in the flexible OLED module stacked structure and the manufacturing method thereof provided by the present invention, the protective film instead of a back plate is used to protect the substrate during a module manufacture process, and when the protective film is removed, the foam layer is still there to support, protect, and provide a buffer to the substrate. Therefore, an overall thickness of the flexible OLED module stacked structure is reduced, the bonding difficulty is little, and ash is less generated during the cutting process, thereby reducing production costs.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A flexible organic light emitting diode (OLED) module stacked structure, comprising:
   a substrate;
   a thin film transistor (TFT) array layer disposed on the substrate;
   an OLED element layer disposed on the TFT array layer;
   a thin film encapsulation layer disposed on the OLED element layer, the thin film encapsulation layer entirely covering the OLED element layer;
   a cover plate disposed at one end of the thin film encapsulation layer; and
   a foam layer disposed on one side of the substrate away from the TFT array layer, wherein the foam layer is made of a combination of foam, copper, and graphite, and an outer lead reinforcing plate is disposed on one side of the foam layer away from the substrate, and wherein the outer lead reinforcing plate, the foam layer, the substrate, the TFT array layer, the OLED element layer, the thin film encapsulation layer, and the cover plate are sequentially disposed from bottom to top; and
   a chip on film (COF) attached to the TFT array layer through an anisotropic conductive film (ACF) disposed between the COF and the TFT array layer.

2. The flexible OLED module stacked structure according to claim 1, further comprising a touch panel, wherein the touch panel is disposed on the thin film encapsulation layer.

3. The flexible OLED module stacked structure according to claim 2, further comprising a polarizing plate, wherein the polarizing plate is disposed on the touch panel.

4. The flexible OLED module stacked structure according to claim 3, wherein an optically clear adhesive (OCA) is disposed among the thin film encapsulation layer, the touch panel, the polarizing plate, and the cover plate for adhering them together.

5. The flexible OLED module stacked structure according to claim 1, wherein a material of the substrate comprises polyimide.

6. The flexible OLED module stacked structure according to claim 1, wherein the cover plate is a glass plate.

7. A manufacturing method of a flexible organic light emitting diode (OLED) module stacked structure, comprising steps as follows:
   S10: coating a glass plate with polyimide (PI) to form a substrate;
   S20: sequentially forming a thin film transistor (TFT) array layer, an OLED element layer, and a thin film encapsulation layer on the substrate;
   S30: removing the glass plate from the substrate;
   S40: adhering a protective film onto one side of the substrate away from the TFT array layer;
   S50: chamfering the substrate;
   S60: adhering a cover plate on one side of the substrate adjacent to the TFT array layer;
   S70: removing the protective film from the substrate;
   S80: adhering a foam layer onto one side of the substrate away from the TFT array layer; and
   S90: bending a bonding pad after adhering an outer lead reinforcing plate and a chip on film (COF) on one side of the foam layer away from the substrate.

8. The manufacturing method of the flexible OLED module stacked structure according to claim 7, further comprising adhering sequentially a touch panel and a polarizing plate onto the thin film encapsulation layer.

9. The manufacturing method of the flexible OLED module stacked structure according to claim 7, wherein in step S50, a laser lift-off process is performed to remove the glass plate from the substrate.

10. The manufacturing method of the flexible OLED module stacked structure according to claim 7, wherein in step S60, a laser chamfering process is performed to chamfer the substrate.

* * * * *